US012727402B2

(12) United States Patent
Khazaka et al.

(10) Patent No.: US 12,727,402 B2
(45) Date of Patent: Sep. 1, 2026

(54) METHOD OF FORMING AN EPITAXIAL LAYER

(71) Applicant: ASM IP Holding B.V., Almere (NL)

(72) Inventors: Rami Khazaka, Leuven (BE); Patricio Romero, Wilsele (BE); Michael Eugene Givens, Oud-Heverlee (BE); Charles Dezelah, Helsinki (FI)

(73) Assignee: ASM IP Holding B.V., Almere (NL)

( * ) Notice: Subject to any disclaimer, the term of this patent is extended or adjusted under 35 U.S.C. 154(b) by 327 days.

(21) Appl. No.: 18/544,019

(22) Filed: Dec. 18, 2023

(65) Prior Publication Data

US 2024/0203730 A1 Jun. 20, 2024

Related U.S. Application Data

(60) Provisional application No. 63/476,335, filed on Dec. 20, 2022.

(51) Int. Cl.

| | |
|---|---|
| ***H10P 14/20*** | (2026.01) |
| ***C30B 25/16*** | (2006.01) |
| ***C30B 25/20*** | (2006.01) |
| ***C30B 29/52*** | (2006.01) |
| ***C30B 31/08*** | (2006.01) |
| ***C30B 33/12*** | (2006.01) |

(52) U.S. Cl.

CPC .......... *H10P 14/3411* (2026.01); *C30B 25/16* (2013.01); *C30B 25/20* (2013.01); *C30B 29/52* (2013.01); *C30B 31/08* (2013.01); *C30B 33/12* (2013.01); *H10P 14/27* (2026.01); *H10P 14/3442* (2026.01); *H10P 14/3444* (2026.01); *H10P 14/3466* (2026.01)

(58) Field of Classification Search

CPC .. H10P 14/3411; H10P 14/27; H10P 14/3442; H10P 14/3444; H10P 14/3466; H10P 14/24; H10P 14/271; H10P 14/2905; H10P 14/2926; H10P 14/40; H10P 50/264; H10P 14/2924; H10P 50/266; C30B 25/16; C30B 25/20; C30B 29/52; C30B 31/08; C30B 33/12; C30B 25/165; C30B 25/04; C30B 29/06; C30B 25/14; C30B 25/18

See application file for complete search history.

(56) References Cited

U.S. PATENT DOCUMENTS

| | | | | |
|---|---|---|---|---|
| 7,041,170 | B2 * | 5/2006 | Fitzgerald | C30B 29/52<br>257/E21.103 |
| 11,139,163 | B2 * | 10/2021 | Maes | H10P 14/6339 |
| 2008/0026149 | A1 * | 1/2008 | Tomasini | H10D 64/0112<br>118/728 |

(Continued)

FOREIGN PATENT DOCUMENTS

| | | | |
|---|---|---|---|
| EP | 4092154 | A1 | 11/2022 |
| WO | 2007140375 | A2 | 12/2007 |

*Primary Examiner* — Mohammed Shamsuzzaman
(74) *Attorney, Agent, or Firm* — Banner & Witcoff, Ltd.

(57) ABSTRACT

A method of forming a Si-comprising epitaxial layer selectively on a substrate and a semiconductor processing apparatus is disclosed. Embodiments of the presently described method of forming the Si-comprising epitaxial layer comprise performing a deposition process for forming the Si-comprising epitaxial layer selectively on a first exposed single crystalline surface relative to a second exposed single crystalline surface being different than the first exposed single crystalline surface.

19 Claims, 3 Drawing Sheets

(56) References Cited

U.S. PATENT DOCUMENTS

Figure 1A:
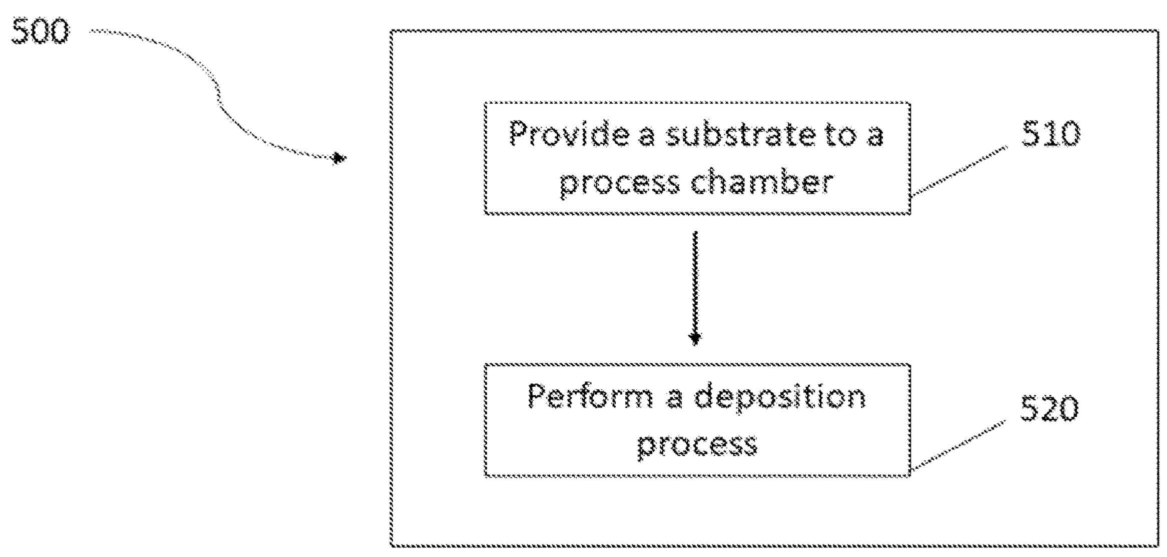

2020/0283298 A1* 9/2020 Schillinger ......... C01B 33/1071
2022/0119952 A1* 4/2022 Howlader ............. C23C 16/401
2024/0087888 A1* 3/2024 Khazaka ................. C30B 29/06

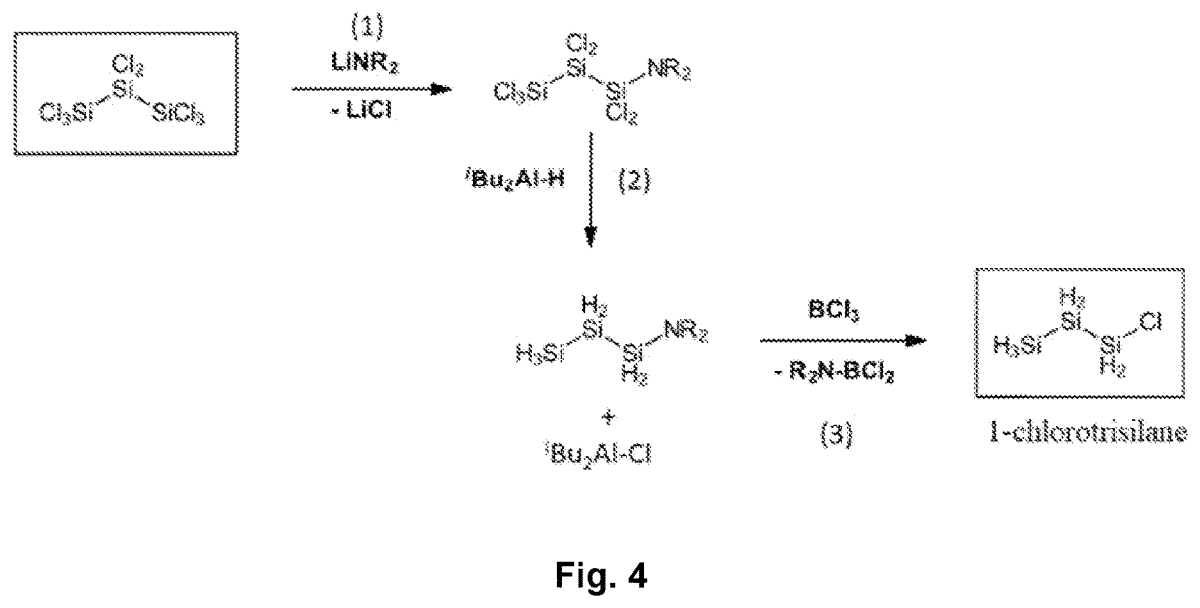

* cited by examiner $R_2N$–$SiCl_2$–$SiCl_2$–$SiCl_2$–$NR_2$ $\xrightarrow[(2)]{^iBu_2Al\text{-}H}$ $R_2N$–$SiH_2$–$SiH_2$–$SiH_2$–$NR_2$ + $^iBu_2Al\text{-}Cl$ $\xrightarrow[-\,R_2N\text{-}BCl_2]{(3)\ BCl_3}$ Cl–$SiH_2$–$SiH_2$–$SiH_2$–Cl 1,3-dichlorotrisilane (1) 2 $LiNR_2$, - 2 LiCl $Cl_3Si$–$SiCl_2$–$SiCl_3$ $Cl_2$
Si
$Cl_3Si$ $SiCl_3$ (1)
$LiNR_2$
- LiCl $Cl_2$
Si
$Cl_3Si$ Si $NR_2$
$Cl_2$ $^iBu_2Al$-H (2)

$H_2$
Si
$H_3Si$ Si $NR_2$
$H_2$
+
$^iBu_2Al$-Cl $BCl_3$
- $R_2N$-$BCl_2$
(3)

$H_2$
Si
$H_3Si$ Si Cl
$H_2$ 1-chlorotrisilane

Fig. 4

METHOD OF FORMING AN EPITAXIAL LAYER

CROSS-REFERENCE TO RELATED APPLICATION(S)

This application claims the benefit of U.S. Provisional Application 63/476,335 filed on Dec. 20, 2022, the entire contents of which are incorporated herein by reference.

FIELD OF INVENTION

The present disclosure relates to a method of forming an epitaxial layer and a substrate processing apparatus for forming the epitaxial layer on a substrate. More specifically, the disclosure relates to a method of and a substrate processing apparatus for forming a Si-comprising epitaxial layer selectively on a substrate.

BACKGROUND OF THE DISCLOSURE

Epitaxy may be considered one of the key processes in semiconductor manufacturing for forming layers of films on a substrate. This may be due to the fact that it allows a high-quality crystalline film growth on the substrate.

As scaling continues in the semiconductor industry, process improvements in the field of epitaxy and epitaxial film growth may become demanding, while presenting new challenges. This may be due to the introduction of new integration schemes relying on selective epitaxial growth with reduced process thermal budget.

Therefore, there may be a need to provide methods capable of realizing epitaxial films selectively on the substrate.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

It may be an object of the present disclosure to enable epitaxial film growth selectively on the substrate.

In a first aspect, the present disclosure relates to a method of forming a Si-comprising epitaxial layer selectively on a substrate. The method may comprise providing a substrate to a process chamber. The substrate may comprise an exposed surface. The exposed surface may comprise a first exposed surface and a second exposed surface. The method may further comprise performing a deposition process, thereby forming the Si-comprising epitaxial layer on the first exposed surface relative to the second exposed surface. The deposition process may comprise providing, to the process chamber, a Si containing precursor. The Si-containing precursor may be halopolysilane precursor. The first exposed surface may be a single crystalline surface and the second exposed surface may be a single crystalline surface having a different crystal orientation than the first exposed surface.

The method according to embodiments of the first aspect of the present disclosure may allow for forming a Si-comprising epitaxial layer selectively on a substrate.

It may be an advantage that forming the Si-comprising epitaxial layer may selectively be done on one of two different single crystalline surfaces, particularly on one of two different single crystalline silicon surfaces.

It may be advantage that the selective formation of the Si-comprising epitaxial layer may be done at a lower temperature. This may particularly be helpful in the implementation of newer device integration schemes in the semiconductor industry such as, for example, buried power rails, monolithic integration as well as source/drain contact formation and high-k/metal gate first integration for next generation of semiconductor devices.

It may further be an advantage that improved growth rate of the epitaxial layer may be obtained at lower temperatures. This may allow for achieving lower temperature epitaxy without compromising from process throughput It may also be an advantage that growth of a single crystalline epitaxial layer may be achieved.

It may further be an advantage that higher active dopant concentration may be achieved in the epitaxial layer. This may further provide the advantage in growing forming source/drain regions of a field effect transistor. Furthermore, this may provide the advantage of lowering source/drain resistivity.

In a second aspect, the present disclosure relates to a substrate processing apparatus. The substrate processing apparatus may be suitable for forming a Si-comprising epitaxial layer selectively on a substrate. The apparatus may comprise a process chamber. The process chamber may be constructed and arranged to hold a substrate. The apparatus may further comprise a silicon precursor storage module. The silicon precursor storage module may comprise a halopolysilane precursor. The apparatus may further comprise a germanium precursor storage module that may comprise germane. The apparatus may further comprise a heater that may be configured for heating and maintaining process temperature in the process chamber and a pressure controller that may be configured for attaining and maintaining process pressure in the process chamber. A controller that may be comprised in the apparatus, may be operably connected to the silicon precursor storage module and to the germanium precursor storage module. The controller may be configured to execute instructions that may be stored in a non-transitory computer readable medium and that may cause the substrate processing apparatus to form the Si-comprising epitaxial layer on the substrate according to embodiments of the first aspect of the present disclosure.

The substrate processing apparatus according to embodiments of the second aspect of the present disclosure may allow for epitaxial growth of a Si-comprising layer selectively on a substrate at lower process temperatures.

It may further be an advantage that the apparatus may provide for epitaxial growth at lower temperatures with improved growth rate, thereby helping to improve process throughput and overall semiconductor manufacturing throughput.

In a third aspect, the present disclosure relates to a method of producing a halopolysilane. The method may comprise providing a halosilane precursor. The halosilane precursor may comprise a first terminal Si atom, a second terminal Si atom and one or more intermediate Si atoms and a halogen atom bonded to the first terminal Si atom, to the second terminal Si atom and to the one or more intermediate Si atoms. The method may further comprise reacting the halosilane precursor with a metal amide by performing a salt-metathesis reaction, thereby forming a first reaction product. The method may further comprise reacting the first reaction product with an aluminum hydride, thereby forming a second reaction product. The second reaction product may be different than the first reaction product. The second reaction product may further be reacted with a chloride of a Group-13 element, by performing a chlorination reaction, thereby forming the halopolysilane.

The method according to embodiments of the third aspect of the present disclosure may allow for obtaining a halopolysilane precursor, being a single source precursor, comprising both Si—H bonds and Si—Cl bonds. Using a single source precursor in an epitaxial growth process may allow for increasing process yield compared to that achieved by using separate precursors with Si—H bonds and Si—Cl bonds.

It may be an advantage that the method of production may be very selective in placing the chlorine atoms in a particular position in the halopolysilane precursor.

It may further be an advantage that the proposed method of production may, advantageously, be high yielding.

BRIEF DESCRIPTION OF THE DRAWING FIGURES

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure Like reference numbers will be used for like elements in the drawings unless stated otherwise. Reference signs in the claims shall not be understood as limiting the scope.

FIG. 1*a*: Flowchart of an exemplary method according to embodiments of the first aspect of the present disclosure.

Figure 1B:
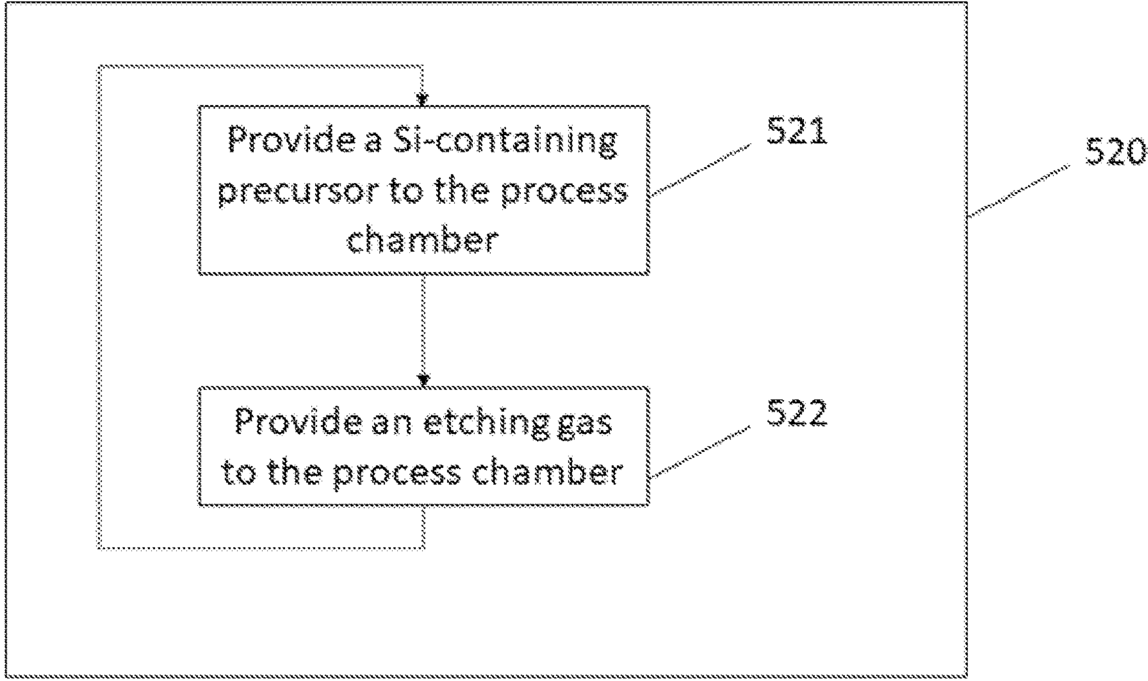

FIG. 1*b*: Flowchart of an exemplary embodiment of the method according to embodiments of the first aspect of the present disclosure.

Figures 2, 3:
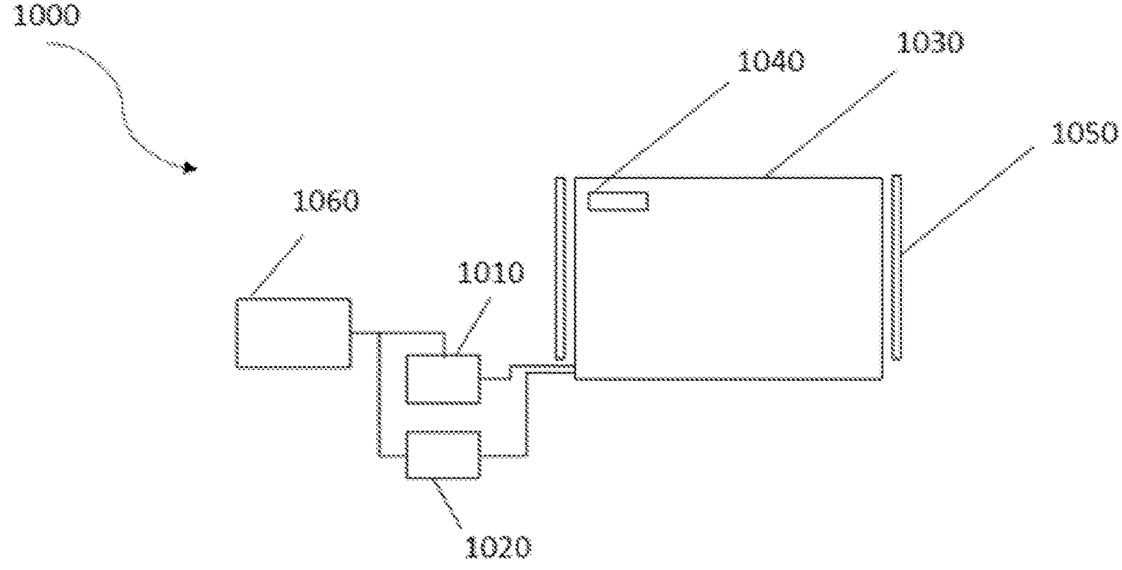

FIG. 2: A schematic representation of a substrate processing apparatus according to embodiments of the second aspect of the present disclosure.

FIG. 3: A representation of a method of production of 1,3-dichlorotrisilane precursor.

FIG. 4: A representation of a method of production of 1-chlorotrisilane precursor.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

As used herein, the term "substrate" may refer to any underlying material or materials, including any underlying material or materials that may be modified, or upon which, a device, a circuit, or a film may be formed. The "substrate" may be continuous or non-continuous; rigid or flexible and combinations thereof. The substrate may be in any form, such as, a plate, or a workpiece. Substrates in the form of a plate may include wafers in various shapes and sizes. Substrates may be made from semiconductor materials, including, for example, silicon, silicon germanium, silicon oxide, gallium arsenide, gallium nitride and silicon carbide.

As examples, a substrate in the form of a powder may have applications for pharmaceutical manufacturing. A porous substrate may comprise polymers. Examples of workpieces may include medical devices (for example, stents and syringes), jewelry, tooling devices, components for battery manufacturing (for example, anodes, cathodes, or separators) or components of photovoltaic cells, etc.

A continuous substrate may extend beyond the bounds of a process chamber where a deposition process occurs. In some processes, the continuous substrate may move through the process chamber such that the process continues until the end of the substrate is reached. A continuous substrate may be supplied from a continuous substrate feeding system to allow for manufacture and output of the continuous substrate in any appropriate form.

Non-limiting examples of a continuous substrate may include a sheet, a non-woven film, a roll, a foil, a web, a flexible material, a bundle of continuous filaments or fibers (for example, ceramic fibers or polymer fibers). Continuous substrates may also comprise carriers or sheets upon which non-continuous substrates are mounted.

The illustrations presented herein are not meant to be actual views of any particular material, structure, or device, but are merely idealized representations that are used to describe embodiments of the disclosure.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and sub-combinations of the various processes, systems, and configurations, and other features, functions, acts, and/or properties disclosed herein, as well as any and all equivalents thereof.

It is to be noticed that the term "comprising", as used herein, should not be interpreted as being restricted to the means listed thereafter. It does not exclude other elements or steps. It is thus, to be interpreted as specifying the presence of the stated features, steps or components as referred to. However, it does not prevent one or more other steps, components, or features, or groups thereof from being present or being added.

It is to be noticed that the term "comprise substantially" used in the claims refers that further components than those specifically mentioned can, but not necessarily have to, be present, namely those not materially affecting the essential characteristics of the material, compound, or composition referred to.

Reference throughout the specification to "embodiments" in various places are not necessarily all referring to the same embodiment, but may. Furthermore, the particular features, structures or characteristics maybe combined in any suitable manner, as would be apparent to one of the ordinary skill in the art from the disclosure, in one or more embodiments.

Reference throughout the specification to "some embodiments" means that a particular structure, feature step described in connection with these embodiments is included in some of the embodiments of the present invention. Thus, phrases appearing such as "in some embodiments" in different places throughout the specification are not necessarily referring to the same collection of embodiments, but may.

The terms first, second, third, and the like in the description and in the claims, are used for distinguishing between similar elements. They are not necessarily used for describing a sequence, either temporally, spatially, in ranking, or in any other manner. It is to be understood that the terms so used are interchangeable under appropriate circumstances and that the embodiments of the disclosure described herein are capable of operation in other sequences than described or illustrated herein.

The following terms are provided only to help in the understanding of the disclosure.

As used herein and unless provided otherwise, the term "polysilane" may refer to a silane that contains two or more silicon atoms such as for example $Si_nH_m$, where n is greater than or equal 2, m is larger than or equal to 2n.

As used herein and unless provided otherwise, the term "halopolysilane" may refer to a polysilane that contains one or more halogen atoms and two or more silicon atoms.

As used herein and unless provided otherwise, the term "chloropolysilane" may refer to a chlorinated polysilane that contains one or more chlorine atoms and two or more silicon atoms.

As used herein and unless provided otherwise, the term "overall semiconductor manufacturing throughput" may refer to the rate at which substrates move through the manufacturing process from the start to finish, thereby obtaining a semiconductor device or an intermediate semiconductor device structure.

As used herein and unless provided otherwise, the term "intermediate semiconductor device structure" may refer to an unfinished semiconductor device that may have processed features on the substrate and that may still need to get further processing to manufacture the final semiconductor device.

As used herein and unless provided otherwise, the term "process throughput" may refer to the number substrates processed in a semiconductor processing apparatus in a given period.

As used herein and unless provided otherwise, the term "exposed surface" may refer to a surface that is being open to the ambient.

The disclosure will now be described by a detailed description of several embodiments of the disclosure. It is clear that other embodiments of the disclosure can be configured according to the knowledge of persons skilled in the art in the absence of departure from the technical teaching of the disclosure. The disclosure is limited only by the terms of the claims included herein.

FIG. 1*a* shows a flowchart of an exemplary method according to embodiments of the first aspect of the present disclosure. The method may be used for forming a Si-comprising epitaxial layer selectively on a substrate.

The method (500) may comprise providing (510) a substrate to a process chamber. In some embodiments, the process chamber may be a single process chamber that may be comprised in a semiconductor processing apparatus. In some embodiments, the process chamber may be one of at least two process chambers that may be comprised in a semiconductor processing apparatus. Having at least two process chambers may allow for improving throughput of the semiconductor processing apparatus.

The substrate may comprise an exposed surface. The exposed surface may comprise a first exposed surface and a second exposed surface. The first exposed surface may be a single crystalline surface. The second exposed surface may be a single crystalline surface that may have a different crystal orientation than the first exposed surface.

The method (500) may further comprise performing (520) a deposition process. This may thereby, lead to the formation of the Si-comprising epitaxial layer selectively on the first exposed surface, relative to the second exposed surface. The deposition process may comprise providing (521), to the process chamber, a Si-containing precursor. The Si-containing precursor may be a halopolysilane precursor.

The selectivity of the formation of the Si-comprising epitaxial layer may change depending on the different chemical behavior of the Si-containing precursor with respect to the first exposed surface and the second exposed surface. This may lead to a difference in growth rate of the Si-comprising epitaxial layer as a function of the difference in crystal orientation. Nucleation delay during the growth of the epitaxial layer may play a role, thereby retarding the growth on the second exposed surface. It is thus, to be noted that in some embodiments, there may also be formation of the Si-comprising epitaxial layer on the second exposed surface. This may be represented by a selectivity value of lower than or equal to 1 with respect to formation of the Si-comprising epitaxial layer on the first exposed surface compared to the second exposed surface.

Therefore, in some embodiments, the deposition process (520) may be a cyclic deposition process that may comprise one or more deposition cycles as schematically represented in FIG. 1*b*. Each deposition cycle may further comprise providing (522) an etching gas to the process chamber. This may provide the advantage of removing the Si-comprising epitaxial layer from the second exposed surface. The provision of the Si-containing precursor (521) to the process chamber and the provision of the etching gas (522) to the process chamber may thus, be performed in a sequential and repeated manner thus, leading to a cyclic deposition and etch (CDE) process. The CDE process may be carried out until the desired thickness of the Si-comprising epitaxial layer is formed on the first exposed surface and where the second exposed surface is free of the Si-comprising epitaxial layer.

In embodiments, the etching gas may comprise an etchant selected from the group consisting of chlorine ($Cl_2$) and bromine ($Br_2$). In embodiments, the etchant gas may be provided in the presence of a carrier gas.

In some embodiments, the etching gas may comprise chlorine ($Cl_2$) gas. Chlorine gas may be provided to the process chamber in the presence of a carrier gas. The flow of $Cl_2$ gas may be in a range of 10 sccm to 100 sccm.

In embodiments, the flow of $Cl_2$ gas may be in a range of from at least 10 sccm to 20 sccm, or from at least 20 sccm to 30 sccm, or from at least 30 sccm to 40 sccm, or from at least 40 sccm to 50 sccm, or from at least 50 sccm to 60 sccm, or from at least 60 sccm to 70 sccm, or from at least 70 sccm to 80 sccm, or from at least 80 sccm to 90 sccm, or from at least 90 sccm to 100 sccm.

In embodiments, the carrier gas may comprise $N_2$, and noble gases such as for example, Ar, Ne, He, Xe and Kr.

In some embodiments, the carrier gas may comprise substantially $N_2$, Ar, He, or combinations thereof.

The method (500) according to embodiments of the first aspect of the present disclosure may thus, be advantageous in providing a Si-comprising epitaxial layer selectively on a substrate. More particularly, it may be an advantage that the formation of the Si-comprising epitaxial layer may be done selectively on one of two different single crystalline surfaces.

In some embodiments, the exposed surface may comprise a third exposed surface. The third exposed surface may be non-monocrystalline. The non-monocrystalline surface may be polycrystalline surface or an amorphous surface. The non-monocrystalline surface may be comprised in a layer of a dielectric material.

In embodiments, the dielectric material may be a nitride, an oxide, an oxynitride, an oxycarbide or an oxynitrocarbide. In some embodiments, the nitride, the oxide, the oxynitride, the oxycarbide or the oxynitrocarbide may comprise silicon.

The method may thus, also be advantageous in facilitating the growth of the Si-comprising epitaxial layer selectively on the first exposed surface compared also to the third exposed surface.

In embodiments, the first exposed surface and the second exposed surface may be of the same material or may comprise the same material.

In embodiments, the first exposed surface and the second exposed surface may be of silicon or may comprise silicon.

Thus, in embodiments, the first exposed surface and the second exposed surface may be or may comprise a single crystalline silicon surface, wherein the second exposed surface may be or may comprise a single crystalline silicon surface that may have a different crystal orientation than the single crystalline silicon surface of the first exposed surface.

In some embodiments, the first exposed surface may comprise a Si {100} crystal facet and the second exposed surface may comprise a high order Si crystal facet.

In some embodiments, the first exposed surface may consist of a Si {100} crystal facet and the second exposed surface may consist of a high order Si crystal facet.

In embodiments, the high order silicon crystal facet may be a Si {110} crystal facet.

In embodiments, the halopolysilane may have the formula $SiH_nX_{3-n}$—$(SiH_2)_p$—$SiH_mX_{3-m}$, wherein n and m are independently selected from an integer having a value of at least 1 to at most 3, and wherein p is an integer from at least 1 to at most 3 and wherein X is a halogen. This may advantageously allow for forming the Si-comprising epitaxial layer at deposition temperatures of 500° ° C. or less. This may further enable the implementation of newer device integration schemes in the semiconductor industry such as, for example, buried power rails, monolithic integration as well as source/drain contact formation and high-k/metal gate first integration for next generation of semiconductor devices, where thermal budget may be becoming an important consideration.

In embodiments, p may be equal to 1. Thus, in embodiments, the halopolysilane precursor may comprise at least three silicon atoms that may include a first terminal silicon and a second terminal silicon and at least one of the first terminal silicon and the second terminal silicon may be bonded to a halogen. Thus, in embodiments, the halopolysilane may be a halo trisilane. This may provide the advantage of forming the Si-comprising epitaxial layer with an improved growth rate at lower process temperatures. This may be thanks to the presence of Si—Si bonds, which are about 15% to 20% weaker than Si—H bonds. Increased growth rate may further allow for improving the throughput of the layer formation process.

In some embodiments, the halogen X may be chlorine.

Thus, in embodiments, the halopolysilane precursor may be chlorotrisilane. Having chlorine in the Si-containing precursor molecule may help to improve crystallinity of the epitaxial layer. It may further help to provide selectivity of the epitaxial layer towards a nitride or an oxide surface. This may be thanks to the presence of the Si—Cl bonds. The nitride surface may, for example, comprise a silicon nitride. The oxide surface may, for example, comprise a silicon oxide.

In some embodiments, the halogen may be bromine.

Thus, in some embodiments, the halopolysilane precursor may be bromotrisilane. In embodiments, the bromotrisilane may be a 1-bromotrisilane or a 1,3-bromotrisilane.

In some embodiments, the halogen may be iodine. Thus, in some embodiments, the halopolysilane precursor may be iodotrisilane. In embodiments, the iodotrisilane may be a 1-iodotrisilane or a 1,3-iodotrisilane.

In embodiments, the halopolysilane precursor may be a 1-chlorotrisilane or a 1,3-dichlorotrisilane. The 1-chlorotrisilane precursor or the 1,3-dichlorotrisilane may provide the advantage of carrying out selective epitaxial layer formation of the Si-comprising layer at lower growth temperatures such as 450° C. or lower. Therefore, in embodiments, a temperature of the process chamber during the performance of the deposition process may be less than 450° C. This may also be referred to as the process temperature.

In some embodiments, the process temperature may be measured via a pyrometer. The pyrometer may be suspended in the process chamber above the substrate.

In some embodiments, the process temperature may be measured by using a thermocouple positioned beneath a support, such as for example a susceptor, that supports the substrate in the process chamber during the process. It is to be noted that the substrate temperature measured by the pyrometer suspended above the substrate in the process chamber and that measured using a thermocouple may differ from each other, particularly at low process temperatures, such as for example, lower than 500° C.

In embodiments, the process chamber may be maintained at a pressure in a range of 10 Torr to 80 Torr during the performing of the deposition process. This may also be referred to as the process pressure. Thus, in embodiments, the pressure may be maintained in a range of from at least 10 Torr to at most 30 Torr, or from at least 30 Torr to at most 50 Torr, or from at least 50 Torr to at most 70 Torr or from at least 70 Torr to at most 80 Torr. The control of the process pressure may be done by a pressure controller.

In embodiments, the Si-containing precursor may be provided, to the process chamber, at a flow in a range of 50 sccm to 1000 sccm. In embodiments, the flow of the Si-containing precursor may be from at least 50 sccm to at most 250 sccm, or from at least 250 sccm to at most 500 sccm, or from at least 500 sccm to at most 750 sccm, or from at least 750 sccm to at most 1000 sccm.

In some embodiments, the Si-containing precursor may be provided, to the process chamber, at a flow of 1000 sccm. This may provide the advantage of obtaining a faster growth rate. This may thus, further lead to improving process throughput.

The vessel that holds the Si-containing precursor, particularly the 1-chlorotrisilane precursor or the 1,3-dichlorotrisilane precursor may be kept at a temperature in a range of 20° C. to 100° C.

In embodiments, the vessel holding the Si-containing precursor may be kept at a temperature in a range of from at least 20° C. to at most 60° C., or from at least 60° C. to at most 100° C.

In embodiments, the selectively formed Si-comprising epitaxial layer may be a doped layer. The presence of dopants in the Si-comprising epitaxial layer may help to reduce the resistivity of the layer. Particularly, the presence of dopant in the epitaxial layer may be advantageous in reducing contact resistance when the Si-comprising epitaxial layer is formed as source/drain of a semiconductor device.

Thus, in embodiments, the Si-containing precursor may be provided, to the process chamber, during an overlapping period with a process gas. The process gas may comprise at least a dopant precursor, thereby forming a doped Si-comprising epitaxial layer.

Thus, the Si-containing precursor may be provided to the process chamber during an overlapping period with the provision of the process gas to the process chamber. In embodiments, the overlapping period between the provision of the Si-containing precursor and the provision of the process gas may be up to about 100%. This may then be referred to as providing the Si-containing precursor, to the process chamber, substantially simultaneously with the process gas.

In embodiments, the dopant precursor may be phosphine, thereby leading to a n-type doped Si-comprising epitaxial layer. An n-type doped Si-comprising epitaxial layer may be advantageous as source/drain for n-type metal oxide semiconductor (n-MOS) devices. Phosphine may be provided to the process chamber at a flow in a range of 50 sccm to 900 sccm. Other n-type dopants that may be present in the Si-comprising epitaxial layer may be other Group V elements such as, for example, arsenic and antimony.

In embodiments, the flow of phosphine may be in a range from at least 50 sccm to at most 200 sccm, or from at least 200 sccm to at most 500 sccm, or from at least 500 sccm to at most 700 sccm, or from at least 700 sccm to at most 900 sccm. It is to be noted that the flow of phosphine may be adapted according to the final dopant concentration envisaged in the epitaxial layer. Furthermore, the flow of phosphine may be adapted taking into account the process that is to be performed following the epitaxial layer growth process. A typical process performed following the epitaxial layer growth is a thermal annealing process, thereby activating the dopants in the epitaxial layer.

In embodiments, the process gas may further comprise a Ge-containing precursor. The dopant precursor may then be a p-type dopant precursor, thereby forming a p-type doped $Si_{1-x}Ge_x$ epitaxial layer. A p-type doped Si-comprising epitaxial layer may be advantageous as source/drain for p-type metal oxide semiconductor (p-MOS) devices.

In embodiments, the concentration (x) of germanium in the $Si_{1-x}Ge_x$ epitaxial layer may be in a range of 30 atomic % to 70 atomic %. In embodiments, the concentration (x) may be in a range from at least 30 atomic % to at most 40 atomic %, or from at least 40 atomic % to at most 60 atomic %, or from at least 60 atomic % to at most 70 atomic %.

In embodiments, the temperature of the process chamber during the deposition process (520) for forming the p-type doped $Si_{1-x}Ge_x$ epitaxial layer may be less than 400° C. The Si-containing precursor may be provided to the process chamber at a flow in a range of 200 sccm to 700 sccm.

In embodiments, the flow of Si-containing precursor may be in a range from at least 200 sccm to at most 300 sccm, or from at least 300 sccm to at most 400 sccm, or from at least 400 sccm to at most 500 sccm, or from at least 500 sccm to at most 600 sccm, or from at least 600 sccm to at most 700 sccm.

In embodiments, the p-type dopant precursor may be diborane ($B_2H_6$), thereby forming a boron-doped epitaxial layer. The Ge-containing precursor may be germane ($GeH_4$), thus, forming a boron doped $Si_{1-x}Ge_x$ epitaxial layer.

In embodiments, diborane may be provided to the process chamber at a flow in a range of 1 sccm to 200 sccm. Germane may be provided to the process chamber at a flow in a range of 200 sccm to 2000 sccm.

In embodiments, diborane may be provided to the process chamber at flow in a range of from at least 1 sccm to 50 sccm, or from at least 50 sccm to 100 sccm, or from at least 100 sccm to 150 sccm, or from at least 150 sccm to 200 sccm.

In embodiments, germane may be provided to the process chamber at a flow in a range of from at least 200 sccm to at most 500 sccm, or from at least 500 sccm to at most 1200 sccm, or from at least 1200 sccm to at most 1500 sccm, or from at least 1500 sccm to at most 1800 sccm, or from at least 1800 sccm to at most 2000 sccm. It is to be noted that the flow of germane precursor may be adapted according to the germanium concentration envisaged in the epitaxial layer.

We now return to FIG. 2 showing a schematic representation of a substrate processing apparatus according to embodiments of the second aspect of the present disclosure The substrate processing apparatus (1000) may be suitable for forming a Si-comprising epitaxial layer selectively on a substrate.

The apparatus (1000) may comprise a process chamber (1030). The process chamber (1030) may be constructed and arranged to hold a substrate. The apparatus (1000) may further comprise a silicon precursor storage module (1010) and a germanium precursor storage module (1020). The silicon precursor storage module (1010) may comprise a halopolysilane precursor. The germanium precursor storage module (1020) may comprise a germane. A heater (1050) may be comprised in the apparatus (1000). The heater (1050) may be configured to heat and maintain a process temperature in the process chamber (1030). A pressure controller (1040) may also be comprised on the apparatus (1000). The pressure controller (1040) may be configured to attain and to maintain process pressure in the process chamber (1030). The apparatus (1000) may further comprise a controller (1060). The controller may be operably connected to the silicon precursor storage module (1010) and to the germanium precursor storage module. The controller (1060) may be configured to execute instructions that may be stored in a non-transitory computer readable medium. The controller (1060) may further be configured to cause the substrate processing apparatus (1000) to form the Si-comprising epitaxial layer on the substrate in accordance with a method according to the embodiments of the first aspect of the present disclosure.

In some embodiments, the controller may be configured to include a processor for executing instructions that may be stored in the non-transitory computer readable medium.

The apparatus (100) may thus, be advantageous to enable epitaxial growth of a Si-comprising layer selectively on a substrate at lower process temperatures.

It may further be an advantage that the apparatus may provide for epitaxial growth at lower temperatures with improved growth rate, thereby helping to improve process throughput of the apparatus. This may further allow for improving the overall semiconductor manufacturing throughput.

In embodiments, the halopolysilane precursor may be a 1-chlorosilane or a 1,3-dichlorotrisilane. This may provide the advantage that the semiconductor processing apparatus may realize selective epitaxial formation of Si-comprising layers at lower process temperatures, such as, for example lower than 450° C.

The embodiments of the present disclosure do not limit the scope of invention as these embodiments are defined by the claims appended herein and their legal equivalents. Any equivalent embodiments are intended to be within the scope of this invention. Modifications of the disclosure that are different from one another, in addition to those disclosed herein, may become apparent to those skilled in the art. Such modifications and the embodiments originating therefrom, are also intended to fall within the scope of the claims appended herein.

Described herein is a method of producing halopolysilane as a third aspect of the present disclosure.

The method may comprise providing a halosilane precursor. The halosilane precursor may comprise a first terminal Si atom, a second terminal Si atom and one or more intermediate Si atoms. The halosilane precursor may further comprise a halogen atom bonded to the first terminal Si atom, to the second terminal Si atom and to the one or more intermediate Si atoms. The production method may further comprise reacting the halosilane precursor with a metal amide by performing a salt-metathesis reaction. This may lead to the formation of a first reaction product.

In embodiments, forming the first reaction product may comprise replacing one of the halogens atoms bonded to at least one of the first terminal Si atom and bonded to the second terminal Si atom by an amino group. The amino group may be represented by —$NR_2$. The choice of the amino group may provide the advantage of forming multiple Si—Cl bonds in the halopolysilane.

In embodiments, the amino group may comprise an alkyl group, an aryl group or an alkyl-silyl group.

In embodiments, the metal amide may be represented by $MNR_2$. In embodiments, M may be any metal that may be chosen from Group I or Group II. In some embodiments, metal amide may comprise lithium.

The method may further comprise reacting the first reaction product with an aluminum hydride. This may lead to the formation of a second reaction product. The second reaction product may be different than the first reaction product.

In embodiments, the aluminum hydride may be di-isobutyl aluminum hydride. Use of di-isobutyl aluminum hydride may act as a hydride source and may provide the advantage of making the second reaction step chemo-selective. Furthermore, it may avoid undesired Si—N scission to occur. It may further help to increase the yield of the second reaction product.

The second reaction product may further be reacted with a chloride of a Group-13 element, by performing a chlorination reaction. This may lead to the formation of the halopolysilane.

In embodiments, forming the second reaction product may comprise replacing the halogen atoms bonded to the first terminal Si atom, bonded to the second terminal Si atom and bonded to the one or more intermediate Si atoms by hydrogen.

In embodiments, the halogens atom may be any one of chlorine, bromine, fluorine or iodine.

In some embodiments, the halogen atom may be chlorine or bromine.

In some embodiments, the halogen atom may be bromine.

In embodiments, the chloride of Group-13 element may be $BCL_3$. This may be advantageous instead of using aggressive mineral acids such as, for example, HCl.

The method according to embodiments of the third aspect of the present disclosure may allow for obtaining a halopolysilane precursor, being a single source precursor, comprising both Si—H bonds and Si—Cl bonds. Using a single source precursor in an epitaxial growth process may allow for increasing process yield compared to that achieved by using separate precursors with Si—H bonds and Si—Cl bonds.

The method may further be advantageous such that it may provide selective placement of the chlorine atoms in a particular position in the halopolysilane precursor.

It may further be an advantage that the proposed method of production may, advantageously, be high yielding.

In embodiments, the halosilane precursor may be a chlorosilane.

In some embodiments, the chlorosilane may be octachlorotrisilane.

In some embodiments, the halopolysilane may be 1,3-dichlorotrisilane.

In some embodiments, the halopolysilane may be 1-chlorotrisilane.

We now return to FIG. 3 and FIG. 4 showing a representation of a method of production of 1,3-dichlorotrisilane precursor and 1-chlorotrisilane precursor, respectively. The proposed method of production may be advantageous in obtaining a Si-containing precursor through the use of a single-source mixed Si—H/Si—Cl precursors for epitaxial growth. The proposed method of production may, advantageously, be highly selective. In other words, the proposed method of production may be very selective in placing the chlorine atoms in a particular position in the precursor molecule as represented in FIG. 3 and FIG. 4. The proposed method of production may, advantageously, also be high yielding.

FIG. 3 shows a representation of a method of production of 1-chlorotrisilane precursor.

The production of 1,3-dichlorotrisilane may start with the use of an octa-chlorotrisilane ($Si_3Cl_8$) precursor. This may be followed by a reaction step (1) involving the addition of a metal amide that may be represented as $MNR_2$. M may be any metal chosen from Group I or Group II. $R_2$ may refer to any alkyl, any aryl or any alkyl-silyl group. This reaction step (1) may be referred to as salt-metathesis and may lead to the replacement of one of the three Cl atoms bonded to the first terminal silicon and bonded to the second terminal silicon of the octa-chlorotrisilane ($Si_3Cl_8$) by the $R_2N$ group thereby, leading to the formation of 1,3-diamino hexachlorotrisilane ($Si_3Cl_6N_2R_4$). A metal chloride (MCl) may be released as a by-product. In the reaction step (1) M may represent Lithium, thus, LiCl may be released. Thus, the metal amide represented in this reaction may be $LiNR_2$.

This may be followed by a further reaction step (2), whereby di-isobutyl aluminum hydride ($^i$Bu2Al—H) may be added to replace the chlorine atoms of 1,3-diamino hexachloro trisilane ($Si_3Cl_6N_2R_4$) with hydrogen atoms, the chlorine atoms being bonded to the first terminal silicon, bonded to the second terminal silicon and bonded to the third silicon atom. As a result of reaction step (2), 1,3 di-amino trisilane ($Si_3H_6N_2R_4$) may be formed as a product and di-isobutyl aluminum chloride ($^iBu_2$Al—Cl) may be released as a by-product.

This may be followed by still a further reaction step (3), which may be a chlorination reaction, whereby boron trichloride may be added and $R_2NBCl_2$ may be released as a by-product. During this reaction step (3), the amino groups ($R_2N$) bonded to the first terminal silicon and to the second terminal silicon may be replaced by chloride atoms, thereby leading to the formation of 1,3-dichlorotrisilane. $R_2$ group of $R_2NBCl_2$ may refer to any alkyl, any aryl or any alkyl-silyl group.

FIG. 4 shows a representation of a method of production of 1-chlorotrisilane precursor.

The production of 1-chlorotrisilane may start with the use of an octa-chlorotrisilane ($Si_3Cl_8$) precursor. This may be followed by a reaction step (1) involving the addition of a metal amide that may be represented as $MNR_2$. M may be any metal chosen from Group I or Group II. $R_2$ may refer to any alkyl, any aryl or any alkyl-silyl group. This reaction step (1) may be referred to as salt-metathesis and may lead to the replacement of one of the three Cl atoms bonded to the second terminal silicon of the octa-chlorotrisilane ($Si_3Cl_8$) by the $R_2N$ group thereby, leading to the formation of 1-aminoheptachloro tri silane ($Si_3Cl_7NR_2$). A metal chloride (MCl) may be released as a by-product. In the reaction step (1) M may represent Lithium, thus, LiCl may be released.

This may be followed by a further reaction step (2), whereby di-isobutyl aluminum hydride ($^i$Bu2Al—H) may be added to replace the chlorine atoms of 1-aminoheptachloro tri silane ($Si_3Cl_7NR_2$) with hydrogen atoms. As a result of reaction step (2), 1-amino trisilane ($Si_3H_7NR_2$) may be formed as a product and di-isobutyl aluminum chloride ($^iBu_2$Al—Cl) may be released as a by-product.

This may be followed by still a further reaction step (3), which may be a chlorination reaction, whereby boron trichloride may be added and $R_2NBCl_2$ may be released as a by-product. During this reaction step (3), the amino group ($R_2N$) bonded to the second terminal silicon may be replaced by a chloride atom, thereby leading to the formation of 1-chlorotrisilane. $R_2$ group of $R_2NBCl_2$ may refer to any alkyl, any aryl or any alkyl-silyl group.

In embodiments, a method of production similar to the one represented in FIG. 3 and FIG. 4 may also be used for obtaining the 1-bromotrisilane, the 1,3-bromotrisilane, the 1-iodotrisilane or the 1,3-iodotrisilane. The starting precursor may thus, be a octa-bromotrisilane ($Si_3Cl_8$) to obtain the 1-bromotrisilane or the 1,3-bromotrisilane and it may be a octa-iodotrisilane ($Si_3Cl_8$) to obtain the 1-iodotrisilane or the 1,3-iodotrisilane.

It is to be noted that the molecules that can be added and products that can be formed in each of the reaction steps (1 to 3) may be adapted accordingly to obtain the 1-bromotrisilane, the 1,3-bromotrisilane, the 1-iodotrisilane or the 1,3-iodotrisilane.

The invention claimed is:

1. A method of forming a Si-comprising epitaxial layer selectively on a substrate, the method comprising:

providing the substrate to a process chamber, the substrate comprising an exposed surface, the exposed surface comprising a first exposed surface and a second exposed surface, and performing a deposition process, thereby forming the Si-comprising epitaxial layer selectively on the first exposed surface, relative to the second exposed surface, the deposition process comprising providing, to the process chamber, a Si-containing precursor and a Ge-containing precursor, wherein the Si-containing precursor is a halopolysilane precursor and wherein the first exposed surface is a single crystalline surface and wherein the second exposed surface is a single crystalline surface having a different crystal orientation than the first exposed surface, and wherein the deposition process is a cyclic deposition process comprising one or more deposition cycles, wherein each deposition cycle further comprises providing an etching gas to the process chamber, thereby removing the Si-comprising epitaxial layer from the second exposed surface, and the cyclic deposition process is carried out until a desired thickness of the Si-comprising epitaxial layer is formed on the first exposed surface and where the second exposed surface is free of the Si-comprising epitaxial layer.

2. The method according to claim 1, wherein the halopolysilane precursor is $SiH_nX_{3-n}$—$(SiH_2)_p$—$SiH_mX_{3-m}$, wherein n and m are independently selected from an integer having a value of at least 1 to at most 3, and wherein p is an integer from at least 1 to at most 3 and wherein X is a halogen.

3. The method according to claim 2, wherein p is equal to 1.

4. The method according to claim 2, wherein X is Cl.

5. The method according to claim 1, wherein the halopolysilane precursor is a chlorotrisilane.

6. The method according to claim 1, wherein the halopolysilane precursor is a 1-chlorotrisilane or a 1,3-dichlorotrisilane.

7. The method according to claim 1, wherein the first exposed surface consists of a Si {100} crystal facet and the second exposed surface consists of a higher order silicon crystal facet.

8. The method according to claim 7, wherein the higher order silicon crystal facet is a Si {110} crystal facet.

9. The method according to claim 1, wherein a temperature of the process chamber during the performing of the deposition process is less than 450° C.

10. The method according to claim 1, wherein the etching gas comprises $Cl_2$ gas and is being provided, into the process chamber, in the presence of a carrier gas, wherein flow of $Cl_2$ gas is in a range of 10 sccm to 100 sccm.

11. The method according to claim 1, wherein the process chamber is maintained at a pressure in a range of 10 Torr to 80 Torr during the performing of the deposition process.

12. The method according to claim 1, wherein the Si-containing precursor is provided to the process chamber at a flow in a range of 50 sccm to 1000 sccm.

13. The method according to claim 1, wherein the Si-containing precursor is provided, to the process chamber, during an overlapping period with a process gas comprising at least a dopant precursor, thereby forming a doped Si-comprising epitaxial layer.

14. The method according to claim 13, wherein the dopant precursor is phosphine and is provided to the process chamber at a flow in a range of 50 sccm to 900 sccm.

15. The method according to claim 13, wherein the Si-containing precursor is provided to the process chamber at a flow at about 1000 sccm.

16. The method according to claim 13, wherein the process gas further comprises the Ge-containing precursor, and wherein the dopant precursor is a p-type dopant precursor, thereby forming a p-doped SiGe epitaxial layer.

17. The method according to claim 16, wherein the Si-containing precursor is provided to the process chamber at a flow in a range of 200 sccm to 700 sccm and wherein a temperature of the process chamber during the performing of the deposition process is less than 400° C.

18. The method according to claim 16, wherein the Ge-containing precursor is GeH4 and wherein the p-type dopant precursor is $B_2H_6$.

19. A substrate processing apparatus for forming the Si-comprising epitaxial layer selectively on the substrate, the apparatus comprising:

the process chamber constructed and arranged to hold the substrate, a silicon precursor storage module comprising a halopolysilane precursor, a germanium precursor storage module comprising a Ge-containing precursor, a heater configured to heat and maintain a process temperature in the process chamber, a pressure controller configured to attain and maintain process pressure in the process chamber, and a controller operably connected to the silicon precursor storage module and to the germanium precursor storage module and configured to execute instructions stored in a non-transitory computer readable medium, and to cause the substrate processing apparatus to form the Si-comprising epitaxial layer on the first exposed surface of the substrate in accordance with a method according to claim 1.

* * * * *